United States Patent
Yoshida et al.

(10) Patent No.: US 11,214,660 B2
(45) Date of Patent: Jan. 4, 2022

(54) PREPREG, LAMINATE, PRINTED WIRING BOARD, CORELESS SUBSTRATE, SEMICONDUCTOR PACKAGE AND METHOD FOR PRODUCING CORELESS SUBSTRATE

(71) Applicant: HITACHI CHEMICAL COMPANY, LTD., Tokyo (JP)

(72) Inventors: Yuma Yoshida, Tokyo (JP); Yuichi Shimayama, Tokyo (JP); Yukio Nakamura, Tokyo (JP); Shinji Tsuchikawa, Tokyo (JP); Katsuhiko Nawate, Tokyo (JP); Shintaro Hashimoto, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 11 days.

(21) Appl. No.: 16/486,188

(22) PCT Filed: Feb. 19, 2018

(86) PCT No.: PCT/JP2018/005660
§ 371 (c)(1),
(2) Date: Aug. 15, 2019

(87) PCT Pub. No.: WO2018/151287
PCT Pub. Date: Aug. 23, 2018

(65) Prior Publication Data
US 2020/0239653 A1 Jul. 30, 2020

(30) Foreign Application Priority Data

Feb. 17, 2017 (JP) .............................. JP2017-028238

(51) Int. Cl.
*H05K 7/00* (2006.01)
*C08J 5/24* (2006.01)
(Continued)

(52) U.S. Cl.
CPC ............ *C08J 5/24* (2013.01); *C08G 73/1071* (2013.01); *H01L 21/4857* (2013.01);
(Continued)

(58) Field of Classification Search
CPC .... C08J 5/24; C08G 73/1071; H01L 21/4857; H01L 23/145; H01L 23/49822; H01L 23/562; H05K 1/036
(Continued)

(56) References Cited

U.S. PATENT DOCUMENTS

2016/0365327 A1* 12/2016 Shimodaira ......... H01L 21/4857

FOREIGN PATENT DOCUMENTS

CN  104812805 A   7/2015
EP    2025696 A1   2/2009
(Continued)

*Primary Examiner* — Andargie M Aychillhum
(74) *Attorney, Agent, or Firm* — Fitch, Even, Tabin & Flannery, LLP

(57) ABSTRACT

The present invention relates to a prepreg including a fiber base material layer containing a fiber base material, a first resin layer formed on one surface of the fiber base material layer, and a second resin layer formed on the other surface of the fiber base material layer, wherein the first resin layer is a layer obtained through layer formation of a resin composition (I) containing, as a main component of resin components, an epoxy resin (A), and the second resin layer is a layer obtained through layer formation of a resin composition (II) containing, as a main component of resin components, an amine compound (B) having at least two primary amino groups in one molecule thereof and a maleimide compound (C) having at least two N-substituted maleimide groups in one molecule thereof; a laminated sheet obtained by using the prepreg; a printed wiring board; a coreless board; a semiconductor package; and a method of producing a coreless board.

9 Claims, 1 Drawing Sheet

(51) Int. Cl.
*C08G 73/10* (2006.01)
*H01L 21/48* (2006.01)
*H01L 23/14* (2006.01)
*H01L 23/00* (2006.01)
*H05K 1/03* (2006.01)
*H05K 3/46* (2006.01)

(52) U.S. Cl.
CPC .......... *H01L 23/145* (2013.01); *H01L 23/562* (2013.01); *H05K 1/036* (2013.01); *C08J 2363/00* (2013.01); *C08J 2479/08* (2013.01); *H05K 3/4682* (2013.01); *H05K 2203/061* (2013.01)

(58) Field of Classification Search
USPC ........................................................ 361/783
See application file for complete search history.

(56) References Cited

FOREIGN PATENT DOCUMENTS

| | | | |
|---|---|---|---|
| EP | 2412743 | A1 | 2/2012 |
| EP | 2543687 | A1 | 1/2013 |
| EP | 2666826 | A1 | 11/2013 |
| JP | 2002-026171 | A | 1/2002 |
| JP | 2005-072085 | A | 3/2005 |
| JP | 2010-043254 | A | 2/2010 |
| JP | 2012-169608 | * | 9/2012 |
| JP | 2012-169608 | A | 9/2012 |
| JP | 5243715 | B2 | 7/2013 |
| JP | 2014-019796 | A | 2/2014 |
| JP | 2014-129521 | * | 7/2014 |
| JP | 2014-129521 | A | 7/2014 |
| JP | 2016-060882 | A | 4/2016 |

* cited by examiner

[Fig. 1]
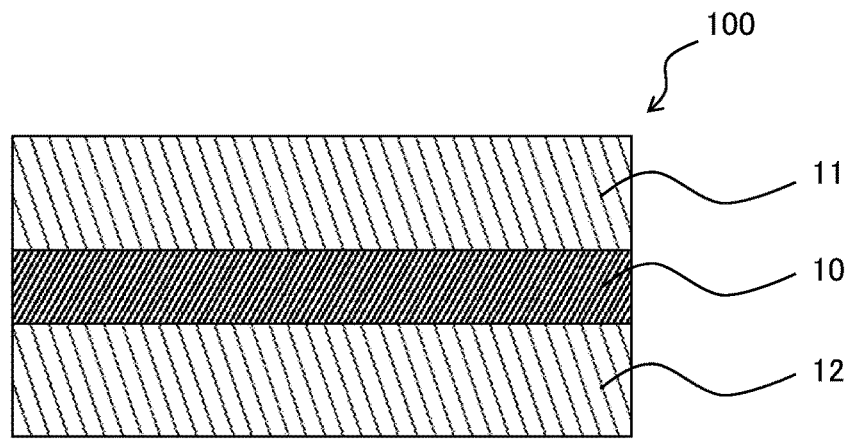
[Fig. 2]
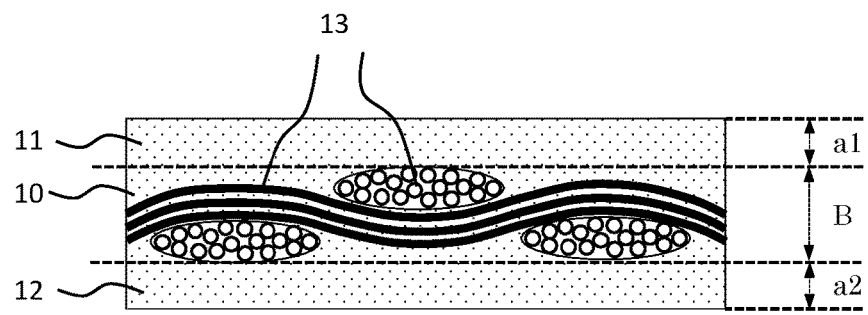
[Fig. 3]
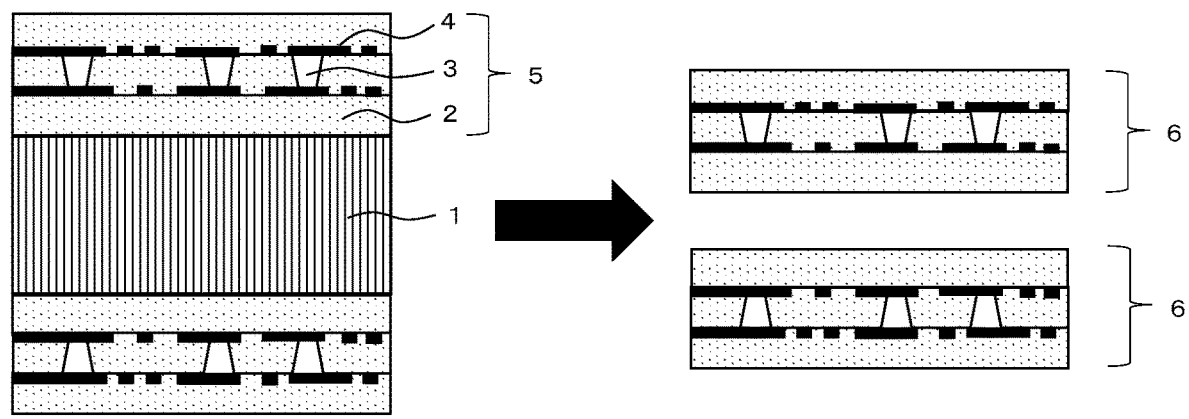

PREPREG, LAMINATE, PRINTED WIRING BOARD, CORELESS SUBSTRATE, SEMICONDUCTOR PACKAGE AND METHOD FOR PRODUCING CORELESS SUBSTRATE

CROSS-REFERENCE TO RELATED APPLICATIONS

This application is a U.S. national phase application filed under 35 U.S.C. § 371 of International Application No. PCT/JP2018/005,660, filed Feb. 19, 2018, designating the United States, which claims benefit from Japanese Patent Application 2017-028238, filed Feb. 17, 2017, which are hereby incorporated herein by reference in their entirety.

TECHNICAL FIELD

The present invention relates to a prepreg, a laminated sheet, a printed wiring board, a coreless board, a semiconductor package, and a method of producing a coreless board.

BACKGROUND ART

Associated with development of density growth and high integration of the wiring density of printed wiring boards in recent years, particularly in an application for semiconductor package boards, warpage to be caused due to a difference in a coefficient of thermal expansion between a chip and a board at the time of component mounting and the time of package assembling becomes a serious issue. The warpage is considered to be one of factors to cause connection failure between a semiconductor device and a printed wiring board, and reduction thereof is demanded.

In particular, as a package structure in response to thinning of a board in recent years, a coreless board not having a core board and composed mainly of a build-up layer capable of achieving high density wiring is investigated (see, for example, PTLs 1 and 2).

In the coreless board, rigidity is lowered due to thinning owing to removal of a support (core board), and therefore, the issue regarding the warpage of a semiconductor package on the occasion of mounting the semiconductor device and packaging it becomes more remarkable. In consequence, in the coreless board, much more effective reduction of the warpage is eagerly desired.

As one of factors to cause the warpage of a semiconductor package, there is exemplified a difference in a coefficient of thermal expansion between a semiconductor device and a printed wiring board. In general, since the coefficient of thermal expansion of the printed wiring board is larger than the coefficient of thermal expansion of the semiconductor device, a stress is generated due to thermal history applied at the time of mounting the semiconductor device, or the like. In consequence, in order to suppress the warpage of a semiconductor package, it is needed to make the coefficient of thermal expansion of the printed wiring board small, thereby minimizing the difference in a coefficient of thermal expansion from the semiconductor device.

Here, it is generally known that a coefficient of thermal expansion of a prepreg obtained by impregnating a resin composition in a glass cloth conforms to the Schapery equation expressed by the following equation.

$$A \cong (A_r E_r F_r + A_g E_g F_g)/(E_r F_r + E_g F_g)$$

In the aforementioned equation, A represents a coefficient of thermal expansion of the prepreg; $A_r$ represents a coefficient of thermal expansion of the resin composition; $E_r$ represents an elastic modulus of the resin composition; $F_r$ represents a volume fraction of the resin composition; $A_g$ represents a coefficient of thermal expansion of the glass cloth; $E_g$ represents an elastic modulus of the glass cloth; and $F_g$ represents a volume fraction of the glass cloth.

From the aforementioned Schapery equation, in the case of using glass cloths having the same physical properties at an arbitrary volume fraction, it may be considered that by reducing the elastic modulus and the coefficient of thermal expansion of the resin composition, it becomes possible to achieve reduction in thermal expansion of the prepreg.

As a material having excellent low thermal expansion properties, a resin composition containing a modified imide resin resulting from modification of a polybismaleimide resin with a siloxane compound is investigated (see, for example, PTL 3). But, while this modified imide resin is excellent in heat resistance, high elastic modulus, low thermal expansion properties, and so on, it involves a drawback to embedding properties of a wiring part (hereinafter also referred to as "moldability"). Then, associated with development of density growth and high integration of the wiring density of printed wiring boards in recent years, the thickness of each layer becomes much thinner, and therefore, a more improvement of the moldability is desired.

A circuit board of a multi-layered structure, such as a build-up layer, is, for example, formed by using two or more sheets of prepreg (for example, a first prepreg and a second prepreg); however, in order to make the circuit board having such a constitution thin, there is adopted a method in which a wiring part is formed on one surface of the first prepreg, and the foregoing wiring part is embedded by the other surface of the second prepreg. In this case, the side of the one surface of the first prepreg is required to have high adhesive properties for forming a wiring part, whereas the side of the other surface of the second prepreg is required to have moldability for embedding the wiring part.

As a prepreg capable of making both thinning and moldability for embedding the wiring part compatible with each other, for example, PTL 4 discloses a prepreg having a resin material supported thereon, in which the fiber base material is biasedly located in the thickness direction of the prepreg.

CITATION LIST

Patent Literature

PTL 1: JP 2005-72085 A
PTL 2: JP 2002-26171 A
PTL 3: JP 2014-129521 A
PTL 4: JP 5243715 B

SUMMARY OF INVENTION

Technical Problem

According to the prepreg described in PTL 4, when thinned, while the moldability can be improved, the warpage on the occasion of mounting a semiconductor device and packaging it was large, and the heat resistance was not satisfactory, too. In consequence, there is demanded a material in which moldability for embedding the wiring part, low thermal expansion properties enabling one to reduce the warpage, and excellent heat resistance are made compatible with each other.

In view of the foregoing existing circumstances, an object of the present invention is to provide a prepreg that is excellent in low thermal expansion properties, heat resistance, and moldability, a laminated sheet obtained by using the prepreg, a printed wiring board, a coreless board, a semiconductor package, and a method of producing a coreless board.

Solution to Problem

In order to achieve the aforementioned object, the present inventors made extensive and intensive investigations. As a result, it has been found that the aforementioned problem can be solved by the present invention, thereby leading to accomplishment of the present invention.

Specifically, the present invention provides the following [1] to [15].

[1] A prepreg including a fiber base material layer containing a fiber base material, a first resin layer formed on one surface of the fiber base material layer, and a second resin layer formed on the other surface of the fiber base material layer, wherein the first resin layer is a layer obtained through layer formation of a resin composition (I) containing, as a main component of resin components, an epoxy resin (A), and the second resin layer is a layer obtained through layer formation of a resin composition (II) containing, as a main component of resin components, an amine compound (B) having at least two primary amino groups in one molecule thereof and a maleimide compound (C) having at least two N-substituted maleimide groups in one molecule thereof.

[2] The prepreg as set forth in the above [1], wherein the component (B) contains a siloxane compound having at least two primary amino groups in one molecule thereof.

[3] The prepreg as set forth in the above [1] or [2], wherein the resin composition (II) further contains an amine compound (D) having an acidic substituent represented by the following general formula (D-1):

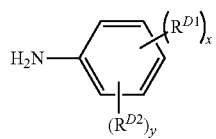

wherein, $R^{D1}$'s each independently represent a hydroxy group, a carboxy group, or a sulfonic acid group, each of which is an acidic substituent; $R^{D2}$'s each independently represent a hydrogen atom, an aliphatic hydrocarbon group having 1 to 5 carbon atoms, or a halogen atom; x is an integer of 1 to 5; y is an integer of 0 to 4; and a sum of x and y is 5.

[4] A prepreg including a fiber base material layer containing a fiber base material, a first resin layer formed on one surface of the fiber base material layer, and a second resin layer formed on the other surface of the fiber base material layer, wherein the first resin layer is a layer obtained through layer formation of a resin composition (I) containing, as a main component of resin components, an epoxy resin (A), and the second resin layer is a layer obtained through layer formation of a resin composition (II) containing, as a main component of resin components, an amino-modified polyimide resin (X) that is a reaction product between an amine compound (B) having at least two primary amino groups in one molecule thereof and a maleimide compound (C) having at least two N-substituted maleimide groups in one molecule thereof.

[5] The prepreg as set forth in the above [4], wherein the component (B) contains a siloxane compound having at least two primary amino groups in one molecule thereof.

[6] The prepreg as set forth in the above [4] or [5], wherein the amino-modified polyimide resin (X) is a reaction product among an amine compound (B) having at least two primary amino groups in one molecule thereof, a maleimide compound (C) having at least two N-substituted maleimide groups in one molecule thereof, and an amine compound (D) having an acidic substituent represented by the following general formula (D-1);

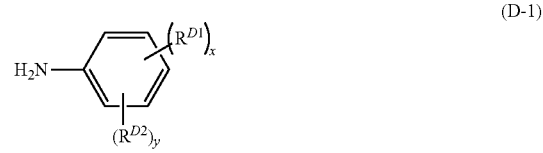

wherein, $R^{D1}$'s each independently represent a hydroxy group, a carboxy group, or a sulfonic acid group, each of which is an acidic substituent; $R^{D2}$'s each independently represent a hydrogen atom, an aliphatic hydrocarbon group having 1 to 5 carbon atoms, or a halogen atom; x is an integer of 1 to 5; y is an integer of 0 to 4; and a sum of x and y is 5.

[7] The prepreg as set forth in any of the above [1] to [6], wherein the resin composition (II) further contains at least one thermosetting resin (G) selected from the group consisting of an epoxy resin and a cyanate resin.

[8] The prepreg as set forth in any of the above [1] to [7], wherein at least one selected from the group consisting of the resin composition (I) and the resin composition (II) further contains an inorganic filler (E).

[9] The prepreg as set forth in any of the above [1] to [8], wherein at least one selected from the group consisting of the resin composition (I) and the resin composition (II) further contains a curing accelerator (F).

[10] A laminated sheet obtained through lamination molding of the prepreg as set forth in any of the above [1] to [9].

[11] A printed wiring board including the laminated sheet as set forth in the above [10].

[12] The prepreg as set forth in any of the above [1] to [9], which is useful for coreless boards.

[13] A coreless board including an insulating layer formed by using the prepreg as set forth in the above [12].

[14] A method of producing a coreless board, including a step of disposing the prepreg as set forth in the above [12] so as to come into contact with a circuit pattern.

[15] A semiconductor package including a semiconductor device mounted on the printed wiring board as set forth in the above [11] or the coreless board as set forth in the above [13].

Advantageous Effects of Invention

In accordance with the present invention, it is possible to provide a prepreg that is excellent in low thermal expansion properties, heat resistance, and moldability, a laminated sheet obtained by using the prepreg, a printed wiring board, a coreless board, a semiconductor package, and a method of producing a coreless board.

BRIEF DESCRIPTION OF DRAWINGS

FIG. 1 is a schematic cross-sectional view of a prepreg of the present invention.

FIG. 2 is a schematic view showing the thickness of each of layers of a prepreg of the present invention.

FIG. 3 is a schematic view showing an embodiment of a production method of a coreless board of the present invention.

DESCRIPTION OF EMBODIMENTS

[Prepreg]

As shown in FIG. 1, the prepreg of the present invention is a prepreg 100 including a fiber base material layer 10 containing a fiber base material 13, a first resin layer 11 formed on one surface of the fiber base material layer 10, and a second resin layer 12 formed on the other surface of the fiber base material layer 10, wherein the first resin layer 11 is a layer obtained through layer formation of a resin composition (I) containing, as a main component of resin components, an epoxy resin (A), and the second resin layer 12 is a layer obtained through layer formation of a resin composition (II) containing, as a main component of resin components, an amine compound (B) having at least two primary amino groups in one molecule thereof and a maleimide compound (C) having at least two N-substituted maleimide groups in one molecule thereof.

Here, the "main component" as referred to in the present invention means a component having the highest content among the respective components. In consequence, the "main component of resin components" means a resin having the highest content among the resin components to be contained in the resin composition.

That is, it is meant that among the contents of the respective resin components to be contained in the resin composition (I), the content of the component (A) is highest; and that among the contents of the respective resin components to be contained in the resin composition (II), the total content of the component (B) and the component (C) is highest.

Though the reason why the prepreg of the present invention is excellent in low thermal expansion properties, heat resistance, and moldability is not elucidated yet, the following may be considered.

The prepreg of the present invention includes, on one surface of the fiber base material layer, the first resin layer obtained through layer formation of the resin composition (I) mainly containing the epoxy resin which reveals favorable moldability. In consequence, on the occasion of embedding an inner layer circuit by using the prepreg of the present invention, it may be considered that by locating the first resin layer at the inner layer circuit side, excellent embedding properties (moldability) are obtained.

Meanwhile, the prepreg of the present invention includes, on the other surface of the fiber base material layer, the second resin layer obtained through layer formation of the resin composition (II) mainly containing the specified amine compound and maleimide compound. A cured product obtained from the resin composition (II) is excellent in heat resistance and low thermal expansion properties, and according to this, it may be considered that an insulating layer formed of the prepreg of the present invention is excellent in heat resistance and low thermal expansion properties while having favorable moldability. The first resin layer and the second resin layer are a layer not containing a fiber base material.

<Fiber Base Material Layer>

The fiber base material layer is a layer containing a fiber base material.

As the fiber base material, well-known materials which are used for various laminated sheets for electrically insulating materials can be used. As for the material of the fiber base material, there are exemplified natural fibers, such as paper and cotton linter; inorganic fibers, such as glass fiber and asbestos; organic fibers of aramid, polyimide, polyvinyl alcohol, polyester, tetrafluoroethylene, acrylic material, etc.; and mixtures thereof. Of these, a glass fiber is preferred from the viewpoint of flame retardancy. The base material using a glass fiber is preferably a glass cloth, and examples thereof include a glass cloth using E glass, C glass, D glass, S glass, etc., or a glass cloth obtained by bonding a short fiber with an organic binder; and a glass cloth obtained by mixing a glass fiber and a cellulose fiber. Of these, a glass cloth using E glass is more preferred.

Such a fiber base material has a shape, such as woven fabric, nonwoven fabric, roving, chopped strand mat, and surfacing mat.

The material and the shape of the fiber base material are properly selected depending upon the desired application or performance of a molded article, or the like, and one kind thereof may be used singly, or two or more materials and shapes can also be combined, as the need arises.

The thickness of the fiber base material is, for example, 10 µm to 0.5 mm, and from the viewpoints of handing properties and making it possible to reveal high-density wiring, it is preferably 10 to 100 µm, more preferably 11 to 50 µm, still more preferably 12 to 30 µm, and especially preferably 13 to 25 µm. In the case of using two or more kinds of fiber base materials, the thickness of the fiber base material is a total value of thicknesses of the two or more kinds of fiber base materials.

The fiber base material may be a fiber base material composed of a single layer or may also be a fiber base material composed of multiple layers.

The fiber base material composed of a single layer as referred to herein means a fiber base material composed of only entangled fibers, and the case where a non-entangled fiber base material exists is classed into the fiber base material composed of multiple layers.

From the viewpoints of heat resistance, moisture resistance, processability, and so on, such a fiber base material may be one having been subjected to a surface treatment with a silane coupling agent, etc. or may also be one having been subjected to a mechanical opening treatment.

Typically, the fiber base material layer contains a resin composition. That is, the fiber base material layer is typically one containing a fiber base material and a resin composition impregnated in the fiber base material.

Examples of the resin composition to be contained in the fiber base material layer include a resin composition (I) and a resin composition (II), each of which is mentioned later, and a mixture thereof.

The prepreg of the present invention is one including a first resin layer on one surface thereof and a second resin layer on the other surface thereof. However, typically, the resin composition (I) that forms the first resin layer also exists in the interior of the fiber base material layer continuously from the first resin layer, and the resin composition (II) that forms the second resin layer also exists in the interior of the fiber base material layer continuously from the second resin layer. In addition, a mixture obtained through contact between the resin composition (I) and the resin composition (II) with each other or the like may also exist. However, it should be construed that the prepreg of the present invention is not limited to this embodiment, and an embodiment in which a fiber base material layer containing a third resin composition different from the resin composition (I) and the resin composition (II) is included, and it includes the first resin layer on one surface thereof and the second resin layer on the other surface thereof may also be adopted. In that case, the third resin composition can be made of a known resin composition to be used for prepregs.

The content of the resin composition to be contained in the fiber base material layer is preferably 40 to 90% by mass, more preferably 60 to 85% by mass, and still more preferably 65 to 80% by mass.

From the viewpoints of handing properties and making it possible to reveal high-density wiring, the thickness of the fiber base material layer is preferably 10 to 100 μm, more preferably 11 to 50 μm, still more preferably 12 to 30 μm, and especially preferably 13 to 25 μm.

The thickness of the fiber base material layer as referred to herein means a thickness expressed by a region B containing the fiber base material in a cross section orthogonal to the planar direction of the prepreg as shown in FIG. 2. The thickness of the fiber base material layer can be, for example, determined in such a manner that the cross section of the prepreg is exposed by a known method, such as mechanical polishing and ion milling, and then observed by a scanning electron microscope (SEM), the thickness of the fiber base material layer is measured in arbitrary ten places, and the measured values are averaged.

<First Resin Layer>

The first resin layer is a layer formed on one surface of the fiber base material layer and is a layer obtained through layer formation of the resin composition (I).

Though the thickness of the first resin layer is not particularly limited, for example, it is 0.5 to 50 μm, preferably 1 to 30 μm, more preferably 2 to 20 μm, still more preferably 3 to 15 μm, and especially preferably 4 to 10 μm.

The thickness of the first resin layer as referred to herein means a thickness expressed by a region a1 not containing the fiber base material in a cross section orthogonal to the planar direction of the prepreg as shown in FIG. 2. The thickness of the first resin layer can be measured by the same method as in the thickness of the fiber base material layer.

(Resin Composition (I))

The resin composition (I) contains the epoxy resin (A) as the main component of resin components.

Here, the "resin components" in the resin composition (I) are mainly the epoxy resin (A), and in the case where the resin composition (I) contains an epoxy resin curing agent and other resin components as mentioned later, and so on, these are included. The respective components which the resin component (I) contains are hereunder described.

[Epoxy Resin (A)]

Examples of the epoxy resin (A) include a bisphenol A type epoxy resin, a bisphenol F type epoxy resin, a bisphenol S type epoxy resin, a phenol novolak type epoxy resin, a cresol novolak type epoxy resin, an α-naphthol/cresol novolak type epoxy resin, a bisphenol A novolak type epoxy resin, a bisphenol F novolak type epoxy resin, a stilbene type epoxy resin, a trizine skeleton-containing epoxy resin, a fluorene skeleton-containing epoxy resin, a triphenolmethane type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a polyfunctional phenol, and a diglycidyl ether compound of a polycyclic aromatic compound, such as anthracene, and a phosphorus-containing epoxy resin having a phosphorus compound introduced into such a compound. These may be used alone or may be used in admixture of two or more thereof. Of these, a biphenyl aralkyl type epoxy resin and an α-naphthol/cresol novolak type epoxy resin are preferred from the viewpoints of heat resistance and flame retardancy.

From the viewpoints of moldability, heat resistance, and chemical resistance, the content of the epoxy resin (A) in the resin component (I) is preferably 50 parts by mass or more, more preferably 60 parts by mass or more, still more preferably 70 parts by mass or more, and especially preferably 80 parts by mass or more based on 100 parts by mass of the solid content of the resin components in the resin composition (I). An upper limit value of the content of the epoxy resin (A) is not particularly limited, for example, it may also be 100 parts by mass or less.

[Epoxy Curing Agent]

The resin composition (I) may further contain an epoxy curing agent. Examples of the epoxy curing agent include polyfunctional phenol compounds, such as a phenol novolak resin, a cresol novolak resin, and an aminotriazine novolak resin; amine compounds, such as dicyandiamide, diaminodiphenylmethane, and diaminodiphenylsulfone; and acid anhydrides, such as phthalic anhydride, pyromellitic anhydride, maleic anhydride, and a maleic anhydride copolymer. These may be used alone or may be used in admixture of two or more thereof.

[Inorganic Filler (E)]

The resin composition (I) may further contain an inorganic filler (E).

Examples of the inorganic filler (E) include silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, glass powder, and hollow glass beads. As the glass, there are preferably exemplified E glass, T glass, and D glass. These may be used alone or may be used in admixture of two or more thereof.

Of these, silica is preferred from the viewpoints of dielectric characteristics, heat resistance, and low thermal expansion properties. Examples of the silica include precipitated silica having a high moisture content, which is produced by a wet method; and dry-method silica not substantially containing bound water, etc., which is produced by a dry method. As for the dry-method silica, there are further exemplified crushed silica, fumed silica, and fused silica (fused spherical silica) depending upon a difference in the production method. Of these, spherical silica is preferred, and fused spherical silica is more preferred from the viewpoints of low thermal expansion properties and the matter that on the occasion of filling in the resin, high fluidity is obtained.

The inorganic filler (E) may also be one obtained through a pre-treatment or integral blend treatment with a coupling agent, such as a silane-based or titanate-based coupling agent, or a surface-treating agent, such as a silicone oligomer.

In the case of using silica as the inorganic filler (E), its average particle diameter is preferably 0.1 to 10 μm, and more preferably 0.3 to 8 μm. When the average particle diameter of silica is 0.1 μm or more, on the occasion of being highly filled in the resin, the fluidity can be kept favorable, whereas when it is 10 μm or less, the mixing probability of coarse particles is reduced so that the generation of a failure to be caused owing to the coarse particles can be suppressed. The average particle diameter as referred to herein indicates a particle diameter at a point corresponding to 50% of the volume when a total volume of the particles is defined as 100%, and a cumulative frequency distribution curve by the particle diameter is determined, and it can be measured by a particle size distribution measurement apparatus adopting the laser diffraction scattering method, or the like.

In the case where the resin composition (I) contains the inorganic filler (E), its content is preferably 20 to 300 parts by mass, more preferably 50 to 250 parts by mass, and still more preferably 70 to 150 parts by mass based on 100 parts by mass of the solid content of the resin components in the resin composition (I). When the content of the inorganic filler (E) is allowed to fall within the aforementioned range, the moldability and the low thermal expansion properties can be kept favorable.

[Curing Accelerator (F)]

The resin composition (I) may further contain a curing accelerator (F).

Examples of the curing accelerator (F) include organic metal salts, such as zinc naphthenate, cobalt naphthenate, tin octanoate, cobalt octanoate, bisacetylacetonatocobalt(II), and trisacetylacetonatocobalt(III); imidazoles and derivatives thereof; organic phosphorus-based compounds, such as a phosphine and a phosphonium salt; secondary amines; tertiary amines; and quaternary ammonium salts. These may be used alone or may be used in admixture of two or more thereof. Of these, for example, zinc naphthenate, an imidazole derivative, and a phosphonium salt are preferred from the viewpoints of a curing accelerating effect and storage stability.

In the case where the resin composition (I) contains the curing accelerator (F), its content is preferably 0.01 to 2 parts by mass, and more preferably 0.05 to 1 part by mass based on 100 parts by mass of the solid content of the resin components in the resin composition (I). When the content of the curing accelerator (F) is allowed to fall within the aforementioned range, the curing accelerating effect and the storage stability can be kept favorable.

[Other Components]

The resin composition (I) may arbitrarily contain known thermosetting resin, organic filler, flame retardant, ultraviolet absorber, antioxidant, photopolymerization initiator, fluorescent brightener, and adhesiveness improver, and so on, within a range where an object thereof is not impaired.

Examples of the thermosetting resin include a polyphenylene ether resin, a phenoxy resin, a polycarbonate resin, a polyester resin, a polyamide resin, a polyimide resin, a xylene resin, a petroleum resin, and a silicone resin.

Examples of the organic filler include resin fillers made of polyethylene, polypropylene, polystyrene, a polyphenylene ether resin, a silicone resin, a tetrafluoroethylene resin, etc.; and resin fillers of a core-shell structure having a core layer in a rubbery state, which is composed of an acrylic acid ester-based resin, a methacrylic acid ester-based resin, a conjugated diene-based resin, etc., and a shell layer in a glassy state, which is composed of an acrylic acid ester-based resin, a methacrylic acid ester-based resin, an aromatic vinyl-based resin, a vinyl cyanide-based resin, etc.

Examples of the flame retardant include halogen-containing flame retardants containing bromine, chlorine, etc.; phosphorus-based flame retardants, such as triphenyl phosphate, tricresyl phosphate, tris(dichloropropyl)phosphate, a phosphoric acid ester-based compound, and red phosphorus; nitrogen-based flame retardants, such as guanidine sulfamate, melamine sulfate, melamine polyphosphate, and melamine cyanurate; phosphazene-based flame retardants, such as cyclophosphazene and polyphosphazene; and inorganic flame retardants, such as antimony trioxide.

Examples of the ultraviolet absorber include benzotriazole-based ultraviolet absorbers. Examples of the antioxidant include hindered phenol-based and hindered amine-based antioxidants. Examples of the photopolymerization initiator include benzophenone-based, benzyl ketal-based, and thioxanthone-based photopolymerization initiators. Examples of the fluorescent brightener include fluorescent brighteners of a stilbene derivative. Examples of the adhesiveness improver include urea compounds, such as silane urea; and silane-based, titanate-based, and aluminate-based coupling agents.

<Second Resin Layer>

The second resin layer is a layer formed on the other surface of the fiber base material layer and is a layer obtained through layer formation of the resin composition (II).

Though the thickness of the second resin layer is not particularly limited, for example, it is 0.5 to 50 μm, preferably 1 to 30 μm, more preferably 2 to 20 μm, still more preferably 3 to 15 μm, and especially preferably 4 to 10 μm.

The thickness of the second resin layer as referred to herein means a thickness expressed by a region a2 not containing the fiber base material in a cross section orthogonal to the planar direction of the prepreg as shown in FIG. 2. The thickness of the second resin layer can be measured by the same method as in the thickness of the fiber base material layer.

In the prepreg of the present invention, a ratio of the thickness of the first resin layer to the thickness of the second layer [(first resin layer)/(second resin layer)] is preferably 20/80 to 80/20, more preferably 30/70 to 70/30, still more preferably 40/60 to 60/40, and especially preferably 50/50 from the viewpoints of low thermal expansion properties, heat resistance, and moldability.

(Resin Composition (II))

The resin composition (II) is one containing, as a main component of resin components, an amine compound (B) having at least two primary amino groups in one molecule thereof (hereinafter also referred to as "amine compound (B)" or "component (B)") and a maleimide compound (C) having at least two N-substituted maleimide groups in one molecule thereof (hereinafter also referred to as "maleimide compound (C)" or "component (C)").

The "resin components" in the resin composition (II) are mainly the amine resin (B) and the maleimide compound (C), and in the case where the resin composition (II) contains an amine compound (D) having an acidic substituent, a thermosetting resin (G), and other resin components as mentioned later, and so on, these are included.

[Amine Compound (B)]

The amine compound (B) is not particularly limited so long as it is an amine compound having at least two primary amino groups in one molecule thereof.

The amine compound (B) is preferably a compound having two primary amino groups in one molecule thereof, and more preferably a diamine compound represented by the following general formula (B-1).

In the general formula (B-1), $X^{B1}$ is a group represented by the following general formula (B1-1) or (B1-2).

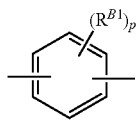
(B1-1)

In the general formula (B1-1), $R^{B1}$'s are each independently an aliphatic hydrocarbon group having 1 to 5 carbon atoms or a halogen atom; and p is an integer of 0 to 4.

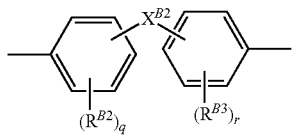
(B1-2)

In the general formula (B1-2), $R^{B2}$'s and $R^{B3}$'s are each independently an aliphatic hydrocarbon group having 1 to 5 carbon atoms or a halogen atom; $X^{B2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (B1-2-1); and q and r are each independently an integer of 0 to 4.

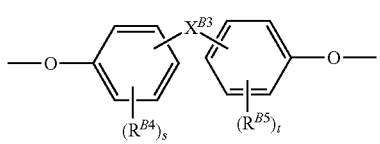
(B1-2-1)

In the general formula (B1-2-1), $R^{B4}$'s and $R^{B5}$'s are each independently an aliphatic hydrocarbon group having 1 to 5 carbon atoms or a halogen atom; $X^{B3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; and s and t are each independently an integer of 0 to 4.

In the general formula (B1-1), examples of the aliphatic hydrocarbon group represented by $R^{B1}$ include a methyl group, an ethyl group, a n-propyl group, an isopropyl group, a n-butyl group, an isobutyl group, a t-butyl group, and a n-pentyl group. The foregoing aliphatic hydrocarbon group is preferably an aliphatic hydrocarbon group having 1 to 3 carbon atoms, and more preferably a methyl group. In addition, examples of the halogen atom include a fluorine atom, a chlorine atom, a bromine atom, and an iodine atom.

Above all, $R^{B1}$ is preferably an aliphatic hydrocarbon group having 1 to 5 carbon atoms.

p is an integer of 0 to 4, and from the viewpoint of easiness of availability, p is preferably an integer of 0 to 2, and more preferably 2. In the case where p is an integer of 2 or more, plural $R^{B1}$'s may be the same as or different from each other.

In the general formula (B1-2), as the aliphatic hydrocarbon group having 1 to 5 carbon atoms and the halogen atom represented by $R^{B2}$ and $R^{B3}$, there are exemplified the same as those in the aforementioned case of RBI. The foregoing aliphatic hydrocarbon group is preferably an aliphatic hydrocarbon group having 1 to 3 carbon atoms, more preferably a methyl group or an ethyl group, and still more preferably an ethyl group.

Examples of the alkylene group having 1 to 5 carbon atoms represented by $X^{B2}$ include a methylene group, a 1,2-dimethylene group, a 1,3-trimethylene group, a 1,4-tetramethylene group, and a 1,5-pentamethylene group. From the viewpoints of heat resistance and low thermal expansion properties, the foregoing alkylene group is preferably an alkylene group having 1 to 3 carbon atoms, and more preferably a methylene group.

Examples of the alkylidene group having 2 to 5 carbon atoms represented by $X^{B2}$ include an ethylidene group, a propylidene group, an isopropylidene group, a butylidene group, an isobutylidene group, a pentylidene group, and an isopentylidene group. Of these, an isopropylidene group is preferred from the viewpoints of heat resistance and low thermal expansion properties.

Among the aforementioned choices, $X^{B2}$ is preferably an alkylene group having 1 to 5 carbon atoms or an alkylidene group having 2 to 5 carbon atoms. More preferred examples thereof are the same as those mentioned above.

q and r are each independently an integer of 0 to 4, and from the viewpoint of easiness of availability, all of q and r are preferably an integer of 0 to 2, and more preferably 0 or 2. In the case where q or r is an integer of 2 or more, plural $R^{B2}$'s or $R^{B3}$'s may be the same as or different from each other, respectively.

In the general formula (B1-2-1), as the aliphatic hydrocarbon group having 1 to 5 carbon atoms and the halogen atom represented by $R^{B4}$ and $R^{B5}$, there are exemplified the same as those in the aforementioned case of $R^{B2}$ and $R^{B3}$, and preferred examples thereof are also the same.

As the alkylene group having 1 to 5 carbon atoms and the alkylidene group having 2 to 5 carbon atoms represented by $X^{B3}$, there are exemplified the same as those in the alkylene group having 1 to 5 carbon atoms and the alkylidene group having 2 to 5 carbon atoms represented by $X^{B2}$, and preferred examples thereof are also the same.

Among the aforementioned choices, $X^{B3}$ is preferably an alkylidene group having 2 to 5 carbon atoms, and more preferred examples thereof are the same as those mentioned above.

s and t are an integer of 0 to 4, and from the viewpoint of easiness of availability, all of s and t are preferably an integer of 0 to 2, more preferably 0 or 1, and still more preferably 0. In the case where s or t is an integer of 2 or more, plural $R^{B4}$'s or $R^{B5}$'s may be the same as or different from each other, respectively.

The general formula (B1-2-1) is preferably represented by the following general formula (B1-2-1').

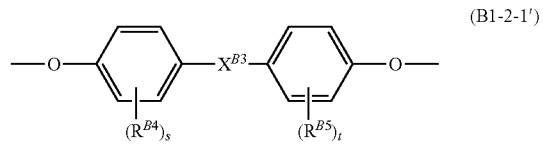
(B1-2-1')

In the general formula (B1-2-1'), $X^{B3}$, $R^{B4}$, $R^{B5}$, s, and t are the same as those in the general formula (B1-2-1), and preferred examples thereof are also the same.

The group represented by the general formula (B1-2) is preferably a group represented by the following general formula (B1-2'), more preferably a group represented by any of the following formulae (B1-i) to (B1-iii), and still more preferably a group represented by (B1-ii).

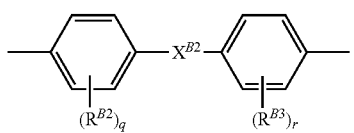
(B1-2')

In the general formula (B1-2'), $X^{B2}$, $R^{B2}$, $R^{B3}$, q, and r are the same as those in the general formula (B1-2), and preferred examples thereof are also the same.

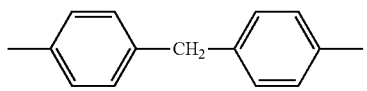
(B 1-i)

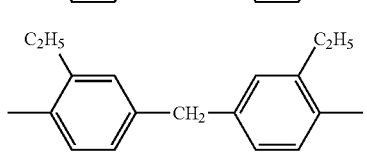
(B 1-ii)

(B 1-iii)
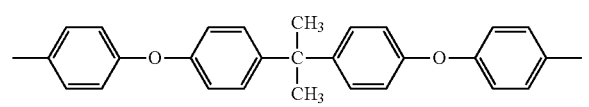

In the general formula (B-1), $X^{B1}$ may be any of the groups represented by the general formulae (B1-1) and (B1-2), and of these, $X^{B1}$ is preferably the group represented by the general formula (B1-2) from the viewpoints of low thermal expansion properties and adhesive strength to a metal circuit.

Specific examples of the amine compound (B) include aromatic diamines, such as p-phenylenediamine, m-phenylenediamine, o-phenylenediamine, 3-methyl-1,4-diaminobenzene, 2,5-dimethyl-1,4-diaminobenzene, 4,4'-diaminodiphenylmethane, 3,3'-dimethyl-4,4'-diaminodiphenylmethane, 3,3'-diethyl-4,4'-diaminodiphenylmethane, 4,4'-diaminodiphenyl ether, 4,4'-diaminodiphenyl sulfone, 3,3'-diaminodiphenyl sulfone, 4,4'-diaminodiphenyl ketone, benzidine, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl) propane, 3,3'-dimethyl-5,5'-diethyl-4,4'-diphenylmethanediamine, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis[4-(4-aminophenoxy)phenyl]sulfone, bis[4-(3-aminophenoxy)phenyl]sulfone, and 9,9-bis(4-aminophenyl) fluorene; aliphatic diamines, such as ethylenediamine, tetramethylenediamine, pentamethylenediamine, hexamethylenediamine, heptamethylenediamine, 2,2,4-trimethylhexamethylenediamine, octamethylenediamine, nonamethylenediamine, decamethylenediamine, 2,5-dimethylhexamethylenediamine, 3-methoxyhexamethylenediamine, 2,5-dimethylheptamethylenediamine, 3-methylheptamethylenediamine, 4,4'-dimethylheptamethylenediamine, 5-methylnonamethylenediamine, 1,4-diaminocyclohexane, 1,3-bis(3-aminopropyl) tetramethyldisiloxane, 2,5-diamino-1,3,4-oxadiazole, and bis(4-aminocyclohexyl)methane; and guanamine compounds, such as melamine, benzoguanamine, acetoguanamine, 2,4-diamino-6-vinyl-s-triazine, 2,4-diamino-6-allyl-s-triazine, 2,4-diamino-6-acryloyloxyethyl-s-triazine, and 2,4-diamino-6-methacryloyloxyethyl-s-triazine. These may be used alone or may be used in admixture of two or more thereof.

Of these, for example, 4,4'-diaminodiphenylmethane, 3,3'-dimethyl-4,4'-diaminobiphenyl, 3,3'-dimethyl-4,4'-diaminodiphenylmethane, 3,3'-diethyl-4,4'-diaminodiphenylmethane, 4,4'-bis(4-aminophenoxy)biphenyl, and 2,2-bis[4-(4-aminophenoxy)phenyl]propane, each of which is an aromatic diamine having high reactivity and capable of being made higher in heat resistance, are preferred; 4,4'-diaminodiphenylmethane, 3,3'-dimethyl-4,4'-diaminobiphenyl, 3,3'-diethyl-4,4'-diaminodiphenylmethane, and 2,2-bis[4-(4-aminophenoxy)phenyl]propane are more preferred from the viewpoints of inexpensiveness and solubility in a solvent; and 3,3'-diethyl-4,4'-diaminodiphenylmethane and 2,2-bis[4-(4-aminophenoxy)phenyl]propane are more preferred from the viewpoints of low thermal expansion properties and dielectric characteristics.

From the viewpoints of low thermal expansion properties and elastic modulus, it is preferred that the amine compound (B) contains a siloxane compound having at least two primary amino groups in one molecule thereof.

As for the amine compound (B) having at least two primary amino groups in one molecule thereof, the siloxane compound having at least two primary amino groups in one molecule thereof is hereinafter sometimes referred to as "amine compound (b)" or "component (b)".

It is preferred that the amine compound (b) contains a structure represented by the following general formula (b-1).

(b-1)

In the formula, $R^{b1}$ and $R^{b2}$ each independently represent an alkyl group, a phenyl group, or a substituted phenyl group; and m represents an integer of 2 to 100.

In the general formula (b-1), examples of the alkyl group represented by $R^{b1}$ and $R^{b2}$ include a methyl group, an ethyl group, a n-propyl group, an isopropyl group, a n-butyl group, an isobutyl group, a t-butyl group, and a n-pentyl group. The alkyl group is preferably an alkyl group having 1 to 5 carbon atoms, more preferably an alkyl group having 1 to 3 carbon atoms, and still more preferably a methyl group.

Examples of the substituent which the phenyl group in the substituted phenyl group has include an alkyl group having 1 to 5 carbon atoms, an alkenyl group having 2 to 5 carbon atoms, and an alkynyl group having 2 to 5 carbon atoms. As the alkyl group having 1 to 5 carbon atoms, there are exemplified the same as those mentioned above. Examples of the alkenyl group having 2 to 5 carbon atoms include a vinyl group and an allyl group. Examples of the alkynyl group having 2 to 5 carbon atoms include an ethynyl group and a propargyl group.

All of $R^{b1}$ and $R^{b2}$ are preferably an alkyl group having 1 to 5 carbon atoms, and more preferably a methyl group.

From the viewpoint of low thermal expansion properties, m is an integer of 2 to 100, and from the viewpoints of compatibility and achieving high elasticity, m is preferably an integer of 5 to 50, and more preferably an integer of 10 to 40.

The amine compound (b) is preferably a compound having at least two primary amino groups at molecular ends thereof, and more preferably a compound represented by the following general formula (b-2).

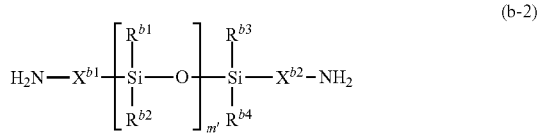

(b-2)

In the formula, $R^{b1}$, $R^{b2}$, $R^{b3}$, and $R^{b4}$ each independently represent an alkyl group, a phenyl group, or a substituted phenyl group; $X^{b1}$ and $X^{b2}$ each independently represent a divalent organic group; and m' represents an integer of 1 to 100.

The alkyl group, the phenyl group, or the substituted phenyl group represented by $R^{b1}$, $R^{b2}$, $R^{b3}$, and $R^{b4}$ are the same as those in $R^{b1}$ and $R^{b2}$ in the general formula (b-1).

Examples of the divalent organic group represented by $X^{b1}$ and $X^{b2}$ include an alkylene group, an alkenylene group, an alkynylene group, an arylene group, —O—, and a divalent connecting group obtained through combination of these groups.

Examples of the alkylene group include alkylene groups, such as a methylene group; an ethylene group, e.g., a 1,1-ethylene group and a 1,2-ethylene group; and a propylene group, e.g., a 1,3-propylene group, a 1,2-propylene group, and a 2,2-propylene group. The carbon number of the alkylene group is preferably 1 to 10, and more preferably 2 to 5.

Examples of the alkenylene group include alkenylene groups having 2 to 10 carbon atoms. Examples of the alkynylene group include alkynylene groups having 2 to 10 carbon atoms.

Examples of the arylene group include arylene groups having 6 to 20 carbon atoms, such as a phenylene group and a naphthylene group.

From the viewpoint of low thermal expansion properties, m' is an integer of 1 to 100, and from the viewpoints of compatibility and achieving high elasticity, m' is preferably an integer of 5 to 50, and more preferably an integer of 10 to 40.

As the component (b), commercially available products can be used. Examples thereof include "KF-8010" (functional group equivalent weight of amino group: 430), "X-22-161A" (functional group equivalent weight of amino group: 800), "X-22-161B" (functional group equivalent weight of amino group: 1,500), "KF-8012" (functional group equivalent weight of amino group: 2,200), "KF-8008" (functional group equivalent weight of amino group: 5,700), "X-22-9409" (functional group equivalent weight of amino group: 700), and "X-22-1660B-3" (functional group equivalent weight of amino group: 2,200) (all of which are manufactured by Shin-Etsu Chemical Co., Ltd.); "BY-16-853U" (functional group equivalent weight of amino group: 460), "BY-16-853" (functional group equivalent weight of amino group: 650), and "BY-16-853B" (functional group equivalent weight of amino group: 2,200) (all of which are manufactured by Dow Corning Toray Co., Ltd.); and "XF42-C5742" (functional group equivalent weight of amino group: 1,280), "XF42-C6252" (functional group equivalent weight of amino group: 1,255), and "XF42-C5379" (functional group equivalent weight of amino group: 745) (all of which are manufactured by Momentive Performance Materials Japan LLC) (the unit of the functional group equivalent weight of amino group is g/mol). These may be used alone or may be used in admixture of two or more thereof.

Of these, for example, from the standpoints that the reactivity at the time of synthesis is high and that low thermal expansion can be achieved, "X-22-161A", "X-22-161B", "KF-8012", "X-22-1660B-3", "XF42-C5379", "XF42-C6252", and "XF42-C5742" are preferred; and from the standpoints that the compatibility is excellent and that a high elastic modulus can be achieved, "X-22-161A", "X-22-161B", "XF42-C6252", and "XF42-C5379" are more preferred.

[Maleimide Compound (C)]

The maleimide compound (C) is not particularly limited so long as it is a maleimide compound having at least two N-substituted maleimide groups in one molecule thereof.

The maleimide compound (C) is preferably a maleimide compound having two N-substituted maleimide groups in one molecule thereof, and more preferably a compound represented by the following general formula (C-1).

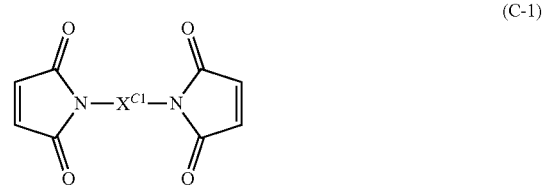

(C-1)

In the general formula (C-1), $X^{C1}$ is a group represented by the following formula (C1-1), (C1-2), (C1-3), or (C1-4).

(C1-1)

In the general formula (C1-1), $R^{C1}$'s are each independently an aliphatic hydrocarbon group having 1 to 5 carbon atoms or a halogen atom; and p1 is an integer of 0 to 4.

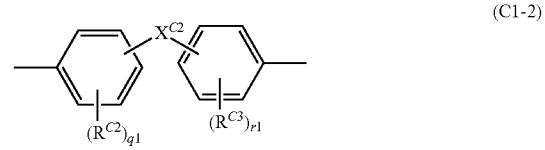

(C1-2)

In the general formula (C1-2), $R^{C2}$'s and $R^{C3}$'s are each independently an aliphatic hydrocarbon group having 1 to 5 carbon atoms or a halogen atom; $X^{C2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (C1-2-1); and q1 and r1 are each independently an integer of 0 to 4.

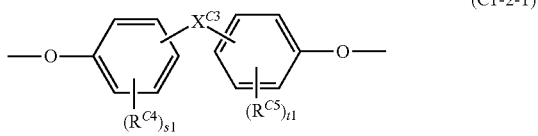

(C1-2-1)

In the general formula (C1-2-1), $R^{C4}$'s and $R^{C5}$'s are each independently an aliphatic hydrocarbon group having 1 to 5 carbon atoms or a halogen atom; $X^{C3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; and s1 and t1 are each independently an integer of 0 to 4.

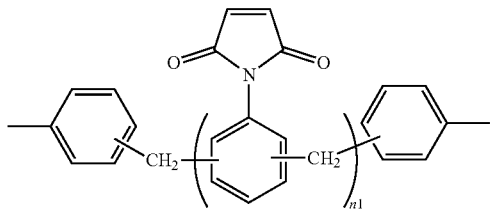

(C1-3)

In the general formula (C1-3), n1 is an integer of 1 to 10.

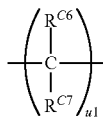

(C1-4)

In the general formula (C1-4), $R^{C6}$'s and $R^{C7}$'s are each independently a hydrogen atom or an aliphatic hydrocarbon group having 1 to 5 carbon atoms; and u1 is an integer of 1 to 8.

In the general formula (C1-1), examples of the aliphatic hydrocarbon group represented by $R^{C1}$ include a methyl group, an ethyl group, a n-propyl group, an isopropyl group, a n-butyl group, an isobutyl group, a t-butyl group, and a n-pentyl group. The aliphatic hydrocarbon group is preferably an aliphatic hydrocarbon group having 1 to 3 carbon atoms, and more preferably a methyl group. In addition, examples of the halogen atom include a fluorine atom, a chlorine atom, a bromine group, and an iodine atom.

Above all, $R^{C1}$ is preferably an aliphatic hydrocarbon group having 1 to 5 carbon atoms.

p1 is an integer of 0 to 4, and from the viewpoint of easiness of availability, p1 is preferably an integer of 0 to 2, more preferably 0 or 1, and still more preferably 0. In the case where p1 is an integer of 2 or more, plural $R^{C1}$'s may be the same as or different from each other.

In the general formula (C1-2), as the aliphatic hydrocarbon group having 1 to 5 carbon atoms and the halogen atom represented by $R^{C2}$ and $R^{C3}$, there are exemplified the same as those in the aforementioned case of $R^{C1}$. The foregoing aliphatic hydrocarbon group is preferably an aliphatic hydrocarbon group having 1 to 3 carbon atoms, more preferably a methyl group or an ethyl group, and still more preferably an ethyl group.

Examples of the alkylene group having 1 to 5 carbon atoms represented by $X^{C2}$ include a methylene group, a 1,2-dimethylene group, a 1,3-trimethylene group, a 1,4-tetramethylene group, and a 1,5-pentamethylene group. From the viewpoints of adhesive properties to a copper foil, low thermal expansion properties, low curing shrinkage properties, heat resistance (solder heat resistance), elastic modulus, and moldability, the foregoing alkylene group is preferably an alkylene group having 1 to 3 carbon atoms, and more preferably a methylene group.

Examples of the alkylidene group having 2 to 5 carbon atoms represented by $X^{C2}$ include an ethylidene group, a propylidene group, an isopropylidene group, a butylidene group, an isobutylidene group, a pentylidene group, and an isopentylidene group. Of these, an isopropylidene group is preferred from the viewpoints of adhesive properties to a copper foil, low thermal expansion properties, low curing shrinkage properties, heat resistance (solder heat resistance), elastic modulus, and moldability.

Among the aforementioned choices, $X^{C2}$ is preferably an alkylene group having 1 to 5 carbon atoms or an alkylidene group having 2 to 5 carbon atoms. More preferred examples thereof are the same as those mentioned above.

q1 and r1 are each independently an integer of 0 to 4, and from the viewpoint of easiness of availability, all of q1 and r1 are preferably an integer of 0 to 2, and more preferably 0 or 2. In the case where q1 or r1 is an integer of 2 or more, plural $R^{C2}$'s or $R^{C3}$'s may be the same as or different from each other, respectively.

In the general formula (C1-2-1), as the aliphatic hydrocarbon group having 1 to 5 carbon atoms and the halogen atom represented by $R^{C4}$ and $R^{C5}$, there are exemplified the same as those in the aforementioned case of $R^{C2}$ and $R^{C3}$, and preferred examples thereof are also the same.

As the alkylene group having 1 to 5 carbon atoms and the alkylidene group having 2 to 5 carbon atoms represented by $X^{C3}$, there are exemplified the same as those in the alkylene group having 1 to 5 carbon atoms and the alkylidene group having 2 to 5 carbon atoms represented by $X^{C2}$, and preferred examples thereof are also the same.

Among the aforementioned choices, $X^{C3}$ is preferably an alkylidene group having 2 to 5 carbon atoms, and more preferred examples thereof are the same as those mentioned above.

s1 and t1 are an integer of 0 to 4, and from the viewpoint of easiness of availability, all of s1 and t1 are preferably an integer of 0 to 2, more preferably 0 or 1, and still more preferably 0. In the case where s1 or t1 is an integer of 2 or more, plural $R^{C4}$'s or $R^{C5}$'s may be the same as or different from each other, respectively.

The general formula (C1-2-1) is preferably represented by the following general formula (C1-2-1').

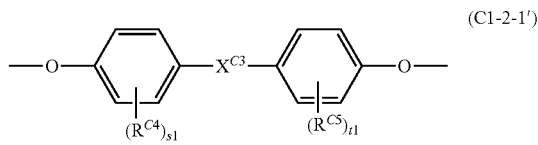

(C1-2-1')

In the general formula (C1-2-1'), $X^{C3}$, $R^{C4}$, $R^{C5}$, s1, and t1 are the same as those in the general formula (C1-2-1), and preferred examples thereof are also the same.

From the viewpoints of adhesive properties to a copper foil, low thermal expansion properties, low curing shrinkage properties, heat resistance (solder heat resistance), elastic modulus, and moldability, the group represented by the general formula (C1-2) is preferably a group represented by the following general formula (C1-2'), more preferably a group represented by any of the following formulae (C1-i) to (C1-iii), and still more preferably a group represented by (C1-iii).

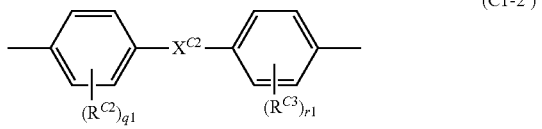
(C1-2')

In the general formula (C1-2'), $X^{C2}$, $R^{C2}$, $R^{C3}$, q1, and r1 are the same as those in the general formula (C1-2), and preferred examples thereof are also the same.

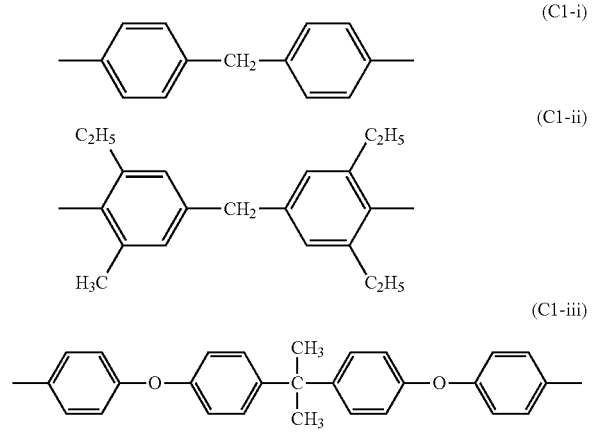

In the general formula (C1-3), n1 is an integer of 1 to 10, and from the viewpoint of easiness of availability, n1 is preferably an integer of 1 to 5, and more preferably an integer of 1 to 3.

In the general formula (C1-4), as the aliphatic hydrocarbon group having 1 to 5 carbon atoms and the halogen atom represented by $R^{C6}$ and $R^{C7}$, there are exemplified the same as those in the aforementioned case of $R^{C1}$ in the general formula (C1-1), and preferred examples thereof are also the same. u1 is an integer of 1 to 8, preferably an integer of 1 to 3, and more preferably 1.

Specific examples of the maleimide compound (C) include bis(4-maleimidophenyl)methane, polyphenylmethane maleimide, bis(4-maleimidophenyl) ether, bis(4-maleimidophenyl)sulfone, 3,3'-dimethyl-5,5'-diethyl-4,4'-diphenylmethane bismaleimide, 4-methyl-1,3-phenylene bismaleimide, m-phenylene bismaleimide, and 2,2-bis[4-(4-maleimidophenoxy)phenyl]propane. These may be used alone or may be used in admixture of two or more thereof. Of these, for example, bis(4-maleimidophenyl)methane, bis(4-maleimidophenyl)sulfone, and 2,2-bis[4-(4-maleimidophenoxy)phenyl]propane are preferred from the viewpoints of having high reactivity and capable of being made higher in heat resistance, and bis(4-maleimidophenyl)methane and 2,2-bis[4-(4-maleimidophenoxy)phenyl]propane are more preferred from the viewpoint of solubility in a solvent.

[Amine Compound (D) Having an Acidic Substituent]

The resin composition (II) may further contain an amine compound (D) having an acidic substituent represented by the following general formula (D-1) (hereinafter also referred to as "component (D)").

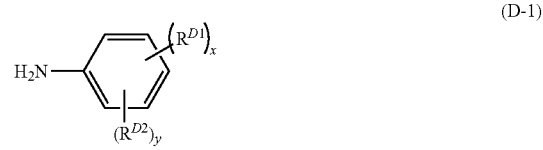
(D-1)

In the formula, $R^{D1}$'s each independently represent a hydroxy group, a carboxy group, or a sulfonic acid group, each of which is an acidic substituent; $R^{D2}$'s each independently represent a hydrogen atom, an aliphatic hydrocarbon group having 1 to 5 carbon atoms, or a halogen atom; x is an integer of 1 to 5; y is an integer of 0 to 4; and a sum of x and y is 5.

Specific examples of the compound (D) having an acidic substituent include m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, and 3,5-dicarboxyaniline. These may be used alone or may be used in admixture of two or more thereof. Of these, m-aminophenol, p-aminophenol, o-aminophenol, p-aminobenzoic acid, m-aminobenzoic acid, and 3,5-dihydroxyaniline are preferred from the viewpoints of solubility and yield of synthesis, and m-aminophenol and p-aminophenol are more preferred from the viewpoint of heat resistance.

[Content of Each of Components in Resin Composition (II)]

From the viewpoints of adhesive properties to a copper foil and moldability, the content of the amine compound (B) in the resin composition (II) is preferably 1 to 40 parts by mass, more preferably 5 to 30 parts by mass, and still more preferably 10 to 25 parts by mass based on 100 parts by mass of the solid content of the resin components in the resin composition (II).

In the case where the resin composition (II) contains the amine compound (b) as the component (B), its content is preferably 1 to 30 parts by mass, more preferably 5 to 20 parts by mass, and still more preferably 7 to 15 parts by mass based on 100 parts by mass of the solid content of the resin components in the resin composition (II) from the viewpoints of adhesive properties to a copper foil and chemical resistance.

From the viewpoints of low thermal expansion properties, heat resistance, and high elastic modulus, the content of the maleimide compound (C) in the resin composition (II) is preferably 40 to 95 parts by mass, more preferably 50 to 90 parts by mass, and still more preferably 60 to 85 parts by mass based on 100 parts by mass of the solid content of the resin components in the resin composition (II).

In the case where the resin composition (II) contains the amine compound (D) having an acidic substituent, its content is preferably 0.5 to 30 parts by mass, more preferably 1 to 10 parts by mass, and still more preferably 1.5 to 5 parts by mass based on 100 parts by mass of the solid content of the resin components in the resin composition (II) from the viewpoint of low thermal expansion properties.

From the viewpoints of low thermal expansion properties, heat resistance, high elastic modulus, adhesive properties to a copper foil, and moldability, the total content of the amine compound (B) and the maleimide compound (C) in the resin composition (II) is preferably 50 parts by mass or more, more preferably 60 parts by mass or more, and still more preferably 70 parts by mass or more based on 100 parts by mass of the solid content of the resin components in the resin composition (II). An upper limit value of the aforementioned total content is not particularly limited, and for example, it may be 100 parts by mass or less, may be 95 parts by mass or less, and may be 85 parts by mass or less.

The component (B) and the component (C) in the resin composition (II) may be each one obtained by separately mixing the components, or may also be one prepared by allowing the component (B) and the component (C) to react with each other to form an amino-modified polyimide resin [hereinafter referred to as "amino-modified polyimide resin (X)"]. Namely, the resin composition (II) may be a resin composition containing the component (B) and the component (C) or may also be a resin composition containing the amino-modified polyimide resin (X) that is a reaction product between the component (B) and the component (C). The amino-modified polyimide resin (X) is hereunder described.

[Amino-Modified Polyimide Resin (X)]

The amino-modified polyimide resin (X) is one obtained through a reaction between the amine compound (B) and the maleimide compound (C) (hereinafter also referred to as "pre-reaction") and is one containing a structural unit (B') derived from the amine compound (B) and a structural unit (C') derived from the maleimide compound (C).

The amino-modified polyimide resin (X) may also be one obtained by further allowing an amine compound (D) having an acidic substituent to react, as the need arises. In that case, the amino-modified polyimide resin (X) becomes one containing a structural unit (D') derived from the amine compound (D) having an acidic substituent.

The molecular weight can be controlled by the aforementioned pre-reaction, and furthermore, the low curing shrinkage properties and the low thermal expansion properties can be improved.

It is preferred to perform the pre-treatment while heating and warming in an organic solvent. The reaction temperature is, for example, 70 to 150° C., and preferably 100 to 130° C. The reaction time is, for example, 0.1 to 10 hours, and preferably 1 to 6 hours.

As the organic solvent which is used for the aforementioned pre-reaction, there are exemplified the same as organic solvents which are used for a varnish as mentioned later. Of these, propylene glycol monomethyl ether is preferred from the standpoint that not only it is soluble and low in toxicity, but also it is high in volatility so that it hardly remains as a residual solvent.

From the viewpoints of solubility and reaction rate, the use amount of the organic solvent is preferably 25 to 2,000 parts by mass, more preferably 35 to 1,000 parts by mass, and still more preferably 40 to 500 parts by mass relative to the sum total of 100 parts by mass of the respective raw material components of the aforementioned pre-reaction.

A reaction catalyst may be arbitrarily used for the pre-reaction. Examples of the reaction catalyst include amines, such as triethylamine, pyridine, and tributylamine; imidazoles, such as methyl imidazole and phenyl imidazole; phosphorus-based catalysts, such as triphenyl phosphine; and alkali metal amides, such as lithium amide, sodium amide, and potassium amide. These may be used alone or may be used in admixture of two or more thereof.

The use amount of the maleimide compound (C) in the pre-reaction is preferably in a range such that the number of maleimide group of the maleimide compound (C) is 2 to 10 times the number of primary amino group of the component (B). When the number of maleimide group of the maleimide compound (C) is 2 times or more, excellent heat resistance is obtained without causing gelation, whereas when it is 10 times or less, excellent solubility in an organic solvent and heat resistance are obtained. In addition, in the case of further allowing the component (D) to react, from the same viewpoints, it is preferred that the number of maleimide group of the maleimide compound (C) falls within a range of 2 to 10 times the sum total of the number of primary amino group of the component (B) and the number of primary amino group of the component (D).

The number of maleimide group of the maleimide compound (C) is expressed by [{use amount of maleimide compound (C)}/{equivalent weight of maleimide group of maleimide compound (C)}]; the number of primary amino group of the component (B) is expressed by [{use amount of component (B)}/{equivalent weight of primary amino group of component (B)}]; and the number of primary amino group of the component (D) is expressed by [{use amount of component (D)}/{equivalent weight of primary amino group of component (D)}].

From the viewpoints of adhesive properties to a copper foil and moldability, the content of the structural unit (B') derived from the amine compound (B) in the amino-modified polyimide resin (X) is preferably 1 to 40% by mass, more preferably 3 to 30% by mass, and still more preferably 5 to 15% by mass.

It is preferred that the amino-modified polyimide resin (X) contains a structural unit (b') derived from the amine compound (b), and its content is preferably 1 to 30% by mass, more preferably 5 to 20% by mass, and still more preferably 7 to 15% by mass in the amino-modified polyimide resin (X) from the viewpoints of adhesive properties to a copper foil and chemical resistance.

From the viewpoints of low thermal expansion properties, heat resistance, and high elastic modulus, the content of the structural unit (C') derived from the maleimide compound (C) in the amino-modified polyimide resin (X) is preferably 40 to 95% by mass, more preferably 50 to 90% by mass, and still more preferably 60 to 85% by mass.

In the case where the amino-modified polyimide resin (X) contains the structural unit (D') derived from the amine compound (D) having an acidic substituent, its content is preferably 0.5 to 30% by mass, more preferably 1 to 10% by mass, and still more preferably 1.5 to 5% by mass in the amino-modified polyimide resin (X) from the viewpoint of low thermal expansion properties.

Suitable contents of the structural unit (B'), the structural unit (b'), the structural unit (C'), and the structural unit (D') based on 100 parts by mass of the solid content of the resin components in the resin composition (II) are the same as the suitable contents of the component (B), the component (b), the component (C), and the component (D), respectively in the resin composition (II).

However, in the case where the resin composition (II) further contains at least one selected from the group consisting of the component (B), the component (b), the component (C), and the component (D) separately from the amino-modified polyimide resin (X), it is preferred that the total content of the respective components and the structural units derived from the respective components are the suitable contents of the component (B), the component (b), the component (C), and the component (D) in the resin composition (II).

In the case where the resin composition (II) contains the amino-modified polyimide resin (X), its content is preferably 50 parts by mass or more, more preferably 60 parts by mass or more, and still more preferably 70% by mass or more based on 100 parts by mass of the solid content of the resin components in the resin composition (II) from the viewpoints of low thermal expansion properties, heat resistance, high elastic modulus, adhesive properties to a copper foil, and moldability. An upper limit value of the content of the amino-modified polyimide resin (X) is not particularly limited, and for example, it may be 100 parts by mass or less, may be 95 parts by mass or less, and may be 85 parts by mass or less.

[Polymerization Initiator]

Though the resin composition (II) has favorable thermosetting reactivity, when it contains a curing agent and/or a polymerization initiator, as the need arises, the heat resistance, the adhesive properties to a copper foil, and the mechanical strength can be more improved.

As the polymerization initiator, a radical polymerization initiator is preferred, and examples thereof include organic peroxides, such as an acyl peroxide, a hydroperoxide, a ketone peroxide, an organic peroxide having a t-butyl group, and a peroxide having a cumyl group. These may be used alone or may be used in admixture of two or more thereof.

[Inorganic Filler (E)]

The resin composition (II) may further contain an inorganic filler (E). As for the inorganic filler (E), there are exemplified the same as those exemplified for the resin composition (I), and suitable embodiments regarding the kind, the content, and the like are the same as those in the case of the resin composition (I).

[Thermosetting Resin (G)]

The resin composition (II) may further contain at least one thermosetting resin (G) selected from the group consisting of an epoxy resin and a cyanate resin.

As for the epoxy resin, there are exemplified the same as those in the aforementioned epoxy resin (A), and suitable embodiments thereof are also the same as those in the case of the epoxy resin (A).

Examples of the cyanate resin include bisphenol type cyanate resins, such as a novolak type cyanate resin, a bisphenol A type cyanate resin, a bisphenol E type cyanate resin, and a tetramethyl bisphenol F type cyanate resin; and prepolymers in which a part of such a bisphenol type cyanate resin has been converted into a triazine. These may be used alone or may be used in admixture of two or more thereof.

In the case where the resin composition (II) contains the thermosetting resin (G), its content is preferably 1 to 40 parts by mass, and more preferably 10 to 30 parts by mass based on 100 parts by mass of the solid content of the resin components in the resin composition (II) from the viewpoints of adhesive properties to a copper foil, heat resistance, and chemical resistance.

In the case where the resin composition (II) contains the thermosetting resin (G), the curing agent, the curing accelerator, and the like as exemplified for the resin composition (I) may be contained.

[Other Components]

The resin composition (II) may further contain the aforementioned other components which the resin composition (I) may contain.

[Production Method of Prepreg]

The prepreg of the present invention can be, for example, produced by a method in which a first resin film formed of the resin composition (I) is laminated on one surface of a fiber base material, and a second resin film formed of the resin composition (II) is laminated on the other surface of the fiber base material.

The first resin film and the second resin film can be, for example, fabricated by coating the resin composition (I) and the resin composition (II) onto a release film, respectively, followed by drying by means of heating or the like.

On the occasion of fabricating the first resin film and the second resin film, from the viewpoint of making handling easy as well as from the viewpoint of improving the productivity of the resin films and the prepreg of the present invention, the resin composition (I) and the resin composition (II) may be each made in a state of varnish in which the respective components are dissolved or dispersed in an organic solvent, as the need arises.

Examples of the organic solvent which is used for the varnish include alcohol-based solvents, such as methanol, ethanol, propanol, butanol, methyl cellosolve, butyl cellosolve, and propylene glycol monomethyl ether; ketone-based solvents, such as acetone, methyl ethyl ketone, methyl isobutyl ketone, and cyclohexanone; ester-based solvents, such as butyl acetate, ethyl acetate, γ-butyrolactone, and propylene glycol monomethyl ether acetate; ether-based solvents, such as tetrahydrofuran; aromatic solvents, such as toluene, xylene, and mesitylene; nitrogen atom-containing solvents, such as dimethyl formamide, dimethyl acetamide, and N-methylpyrrolidone; and sulfur atom-containing solvents, such as dimethyl sulfoxide. These may be used alone or may be used in admixture of two or more thereof.

Of these, methyl ethyl ketone, methyl isobutyl ketone, cyclohexanone, methyl cellosolve, and propylene glycol monomethyl ether are preferred from the viewpoint of solubility; and methyl isobutyl ketone, cyclohexanone, and propylene glycol monomethyl ether are more preferred from the viewpoint of low toxicity.

The solid content of the resin composition (I) or resin composition (II) in the varnish is preferably 40 to 90% by mass, and more preferably 50 to 80% by mass of the whole of the varnish. When the solid content is allowed to fall within the aforementioned range, the coating properties become favorable, and the productivity of the resin film and the prepreg is excellent.

As for coating on the occasion of fabricating the resin film, a known coating machine, such as a die coater, a comma coater, a bar coater, a kiss coater, and a roll coater, can be used. Such a coating machine may be properly selected according to the desired thickness of the resin film.

Examples of the release film which is used for the resin film include organic films, such as polyethylene terephthalate (PET), biaxially oriented polypropylene (OPP), polyethylene, polyvinyl fluorate, and a polyimide; and films of copper or aluminum as well as films of an alloy of such a metal. Such a release film may be one having been subjected to a release treatment with a release agent.

The lamination may be performed by a known method, such as roll lamination using pressing rolls and vacuum lamination. From the viewpoint of productivity, roll lamination is preferred. As for the condition of roll lamination, the lamination can be performed at a heating temperature of 50 to 150° C. under a linear pressure of 0.1 to 1.0 MPa at a rate of 0.5 to 5 m/min. As for the atmosphere on the occasion of lamination, though it may be either atmospheric pressure or reduced pressure, the atmospheric pressure is preferred from the viewpoint of productivity.

Though the lamination of the first resin film and the lamination of the second resin film may be performed separately, it is preferred to perform these laminations simultaneously from the viewpoint of productivity. That is, it is preferred that the first resin film is disposed on one surface of the fiber base material, the second resin film is disposed on the other surface of the aforementioned fiber base material, and the first resin film and the second resin film are simultaneously laminated by means of roll lamination or the like, thereby forming the first resin layer and the second resin layer while impregnating the resin composition (I) and the resin composition (II) in the fiber base material.

The surfaces of the first resin film and the second resin film, each of which is brought into contact with the fiber base material (resin layer-forming surfaces), may be heated in advance prior to lamination. The heating position may be, for example, adjusted in such a manner that the center of the heating surface of a heater is positioned 10 to 50 mm before the pressing rolls, and the heating temperature is 100 to 150° C., and preferably 110 to 140° C. in terms of a surface temperature at the center of the heating surface.

The fiber base material may be similarly heated in advance prior to lamination. The temperature of the fiber base material may be, for example, 100 to 170° C., and preferably 120 to 150° C.

For heating, for example, a halogen heater can be used.

Though the thickness of the whole of the prepreg may be properly regulated according to the thickness of the inner layer circuit or the like, from the viewpoints of thinning of the board, moldability, and workability, it is preferably 10 μm or more, and more preferably 20 μm or more, and it is preferably 700 μm or less, more preferably 500 μm or less, still more preferably 200 μm or less, yet still more preferably 100 μm or less, even yet still more preferably 80 μm or less, especially preferably 50 μm or less, and most preferably 40 μm or less.

[Laminated Sheet]

The laminated sheet of the present invention is one obtained through laminate molding of the prepreg of the present invention.

The laminated sheet of the present invention can be produced through laminate molding of a constitution in which 1 to 20 sheets of the prepreg of the present invention are superimposed, and a metal foil is disposed on one surface or both surfaces thereof. The metal foil is not particularly limited so long as it is one used for a laminated sheet for electrical insulating materials.

The metal of the metal foil is preferably copper, gold, silver, nickel, platinum, molybdenum, ruthenium, aluminum, tungsten, iron, titanium, chromium, or an alloy containing at least one of these metal elements.

As for the molding condition, for example, methods of a laminated sheet for electrical insulating materials and a multi-layered sheet are applicable. The molding can be performed by using a multi-stage press, a multi-stage vacuum press, a continuous molding machine, an autoclave molding machine, or the like under a condition at a temperature of 100 to 250° C. and a pressure of 0.2 to 10 MPa for a heating time of 0.1 to 5 hours. In addition, the laminated sheet of the present invention can also be produced by combining the prepreg of the present invention with a wiring board for inner layer and performing laminate molding.

[Printed Wiring Board]

The printed wiring board of the present invention is one containing the laminated sheet of the present invention.

The printed wiring board of the present invention can be produced by subjecting a conductor layer (metal foil) disposed on one surface or both surfaces of the laminated sheet of the present invention to circuit processing. Though a method of forming a wiring pattern is not particularly limited, examples thereof include known methods, such as a subtractive process, a full-additive process a semi-additive process (SAP), and a modified semi-additive process (m-SAP).

Specifically, first of all, the conductor layer of the laminated sheet of the present invention is subjected to wiring processing by the aforementioned method; subsequently, a plurality of the wiring-processed laminated sheets are laminated via the prepreg of the present invention; and the resultant is subjected to heating press processing, thereby comprehensively forming it into a multilayered structure. Thereafter, the printed wiring board of the present invention can be produced through the formation of through-holes or blind via holes by means of drill processing or laser processing and then the formation of an interlayer wiring by plating or applying a conductive paste.

[Coreless Board and its Production Method]

The coreless board of the present invention is a coreless board containing an insulating layer formed by using the prepreg of the present invention. In view of the fact that the prepreg of the present invention has such characteristic features that it is excellent in heat resistance, low thermal expansion properties, and moldability, it is especially suitable as a prepreg for coreless boards.

The coreless board can be, for example, produced by a method in which a build-up layer having a conductor layer and an insulating layer alternatively laminated each other is formed on a support (core board) by using the prepreg of the present invention, and the support is then separated. A method of forming the build-up layer is not particularly limited, and a known method can be adopted. For example, the build-up layer can be formed by the following method (see FIG. 3).

First of all, a prepreg 2 of the present invention is disposed on a support (core board) 1. The prepreg 2 may be disposed after disposing an adhesive layer on the support (core board) 1. Thereafter, the prepreg 2 is heated and cured to form an insulating layer. Subsequently, via holes 3 are formed by a drill cutting method, a laser processing method using a YAG laser, a $CO_2$ laser, etc., or other method, and then optionally subjected to a surface roughening treatment and a desmearing treatment. Subsequently, a circuit pattern 4 is formed by the aforementioned method. Subsequently, the prepreg 2 of the present invention is disposed so as to come into contact with the circuit pattern 4, and heated and cured to form an insulating layer. By repeating the foregoing steps, a build-up layer 5 is formed. By separating the formed build-up layer 5 from the support (core board) 1, a coreless board is obtained. The build-up layer 5 may be formed on one surface or both surfaces of the support (core board) 1.

As shown in FIG. 3, on the occasion of using the prepreg of the present invention for production of a coreless board, at the time of further disposing the prepreg 2 of the present invention on the circuit pattern 4, by disposing the prepreg of the present invention such that the first resin layer thereof comes into contact with the circuit pattern 4, favorable moldability can be brought.

The coreless board of the present invention is one containing at least one insulating layer obtained through curing of the prepreg of the present invention, and it may also contain an insulating later obtained through curing a prepreg other than the prepreg of the present invention, a resin film, or the like.

The thickness of the coreless board of the present invention is typically small because it does not include a core board, and specifically, it is preferably 0.08 to 0.2 mm, more preferably 0.09 to 0.18 mm, and still more preferably 0.1 to 0.15 mm.

[Semiconductor Package]

The semiconductor package of the present invention is one having a semiconductor mounted on the printed wiring board or coreless board of the present invention. The semiconductor package of the present invention can be, for example, produced by mounting a semiconductor chip, a memory, and so on at a predetermined position of the printed wiring board or coreless board of the present invention.

EXAMPLES

The present invention is hereunder described in more detail by reference to the following Examples, but it should be construed that these Examples do not limit the present invention. A copper clad laminated sheet obtained in each of the Examples was evaluated for its performances by the following methods.

(1) Copper Foil Peel Strength

A resist having a width of 3 mm was formed on an outer layer copper foil of a copper clad laminated sheet obtained in each of the Examples and then dipped in a copper etching liquid, thereby fabricating an evaluation board having the outer layer copper foil having a width of 3 mm as a peel strength measurement part. A load at the time when one end of the copper foil of the peel strength measurement part was taken off at an interface between the copper foil and the board, grasped by a gripper, and then ripped at room temperature (25° C.) at a tensile rate in the vertical direction of 50 mm/min by using a tensile tester (a trade name: AUTOGRAPH S-100, manufactured by Shimadzu Corporation) was measured. The results are shown in Table 1.

(2) Coefficient of Thermal Expansion

A copper clad laminated sheet obtained in each of the Examples was dipped in a copper etching liquid to remove the copper foil, thereby fabricating an evaluation board of 30 mm in length (X-direction), 5 mm in width (Y-direction), and 0.12 mm in thickness (Z-direction), which was then subjected to a thermomechanical analysis with a TMA tester (a trade name: Q400, manufactured by TA Instruments) by the tension method. As for the thermomechanical analysis, after installing the evaluation board in the aforementioned tester in the X-direction, the analysis was continuously performed two times at a load of 5 g and at a temperature rise rate of 10° C./min, an average coefficient of thermal expansion at from 30° C. to 100° C. in the second analysis was calculated, and this was defined as a value of coefficient of thermal expansion. The results are shown in Table 1.

(3) Flexural Elastic Modulus

A copper clad laminated sheet obtained in each of the Examples was dipped in a copper etching liquid to remove the copper foil, thereby fabricating an evaluation board of 25 mm×50 mm, which was then measured with a 5-ton tensilon (manufactured by Orientec Co., Ltd.) at room temperature (25° C.) under a condition at a crosshead speed of 1 mm/min and a span distance of 20 mm. The results are shown in Table 1.

(4) Glass Transition Temperature (Tg)

A copper clad laminated sheet obtained in each of the Examples was dipped in a copper etching liquid to remove the copper foil, thereby fabricating an evaluation board of 30 mm in length (X-direction), 5 mm in width (Y-direction), and 0.12 mm in thickness (Z-direction), which was then subjected to a thermomechanical analysis with a TMA tester (a trade name: Q400, manufactured by TA Instruments) by the tension method. As for the thermomechanical analysis, after installing the evaluation board in the aforementioned tester in the X-direction, the analysis was continuously performed two times at a load of 5 g and at a temperature rise rate of 10° C./min, and a glass transition temperature (Tg) which is expressed by the point of intersection of different tangents of the second thermal expansion curve was determined. The results are shown in Table 1.

(5) Copper-Stuck Solder Heat Resistance

A 25 mm-square evaluation board was fabricated from a copper clad laminated sheet obtained in each of the Examples; the evaluation board was floated in a solder bath at a temperature of 288° C. for 10 minutes; and the appearance of the evaluation board was observed through visual inspection and evaluated according to the following criteria. The results are shown in Table 1.

A: Blister was not confirmed.
B: Blister was slightly confirmed.
C: Blister was remarkably confirmed.

(6) Moldability (Presence or Absence of Void)

On a circuit surface of a copper clad laminated sheet which had been subjected to circuit processing at a remaining copper rate of 60%, a prepreg obtained in each of the Examples was laminated such that the first resin layer was located on the circuit surface side, and a copper foil having a thickness of 12 μm was further disposed thereon. Subsequently, this was sandwiched by 530 mm-square SUS-made mirror plates having a thickness of 1.8 mm, and the resultant was pressed for 90 minutes by using a multi-stage vacuum press in a vacuum atmosphere under a condition at a temperature rise rate of 3 to 4° C./min in a region of the product temperature of from 60 to 160° C. and at a pressure of 2.5 MPa and at a maximum holding temperature of 220° C., thereby fabricating a copper clad laminated sheet. The copper foil of the obtained copper clad laminated sheet was removed by means of etching, and the appearance of the prepreg after curing was observed through visual inspection and evaluated according to the following criteria. The results are shown in Table 1.

A; A void was not confirmed.
B; A void was slightly confirmed.
C: A void was remarkably confirmed.

[Production of Amino-Modified Polyimide Resin (X)]

Production Example 1

(Production of Amino-Modified Polyimide Resin (X-1))

In a reaction vessel having a capacity of 2 liters, which is capable of being heated and cooled and is equipped with a thermometer, an agitator, and a water quantity meter having a reflux condenser, 30.0 g of 3,3'-diethyl-4,4'-diaminodiphenylmethane (a trade name: KAYAHARD (registered trademark) A-A, manufactured by Nippon Kayaku Co., Ltd.), 120.0 g of 2,2-bis[4-(4-maleimidophenoxy)phenyl]propane (a trade name: BMI-4000, manufactured by Daiwa Kasei Industry Co., Ltd.), and 250.0 g of propylene glycol monomethyl ether were charged and allowed to react with each other at 100° C. for 3 hours, thereby obtaining an amino-modified polyimide resin (X-1)-containing solution.

Production Example 2

(Production of Amino-Modified Polyimide Resin (X-2))

In a reaction vessel having a capacity of 2 liters, which is capable of being heated and cooled and is equipped with a thermometer, an agitator, and a water quantity meter having a reflux condenser, 15.0 g of both-end amine-modified siloxane (a trade name; X-22-161A, manufactured by Shin-Etsu Chemical Co., Ltd., which is a siloxane compound having a primary amino group at the both ends of the molecule; functional group equivalent weight of amino group: 800 g/mol), 15.0 g of 3,3'-diethyl-4,4'-diaminodiphenylmethane (a trade name: KAYAHARD (registered trademark) A-A, manufactured by Nippon Kayaku Co., Ltd.), 120.0 g of 2,2-bis[4-(4-maleimidophenoxy)phenyl]propane (a trade name: BMI-4000, manufactured by Daiwa Kasei Industry Co., Ltd.), and 250.0 g of propylene glycol monomethyl ether were charged and allowed to react with each other at 100° C. for 3 hours, thereby obtaining an amino-modified polyimide resin (X-2)-containing solution.

Production Example 3

(Production of Amino-Modified Polyimide Resin (X-3))
In a reaction vessel having a capacity of 2 liters, which is capable of being heated and cooled and is equipped with a thermometer, an agitator, and a water quantity meter having a reflux condenser, 15.0 g of both-end amine-modified siloxane (a trade name: X-22-161A, manufactured by Shin-Etsu Chemical Co., Ltd., which is a siloxane compound having a primary amino group at the both ends of the molecule; functional group equivalent weight of amino group: 800 g/mol), 12.0 g of 3,3'-diethyl-4,4'-diaminodiphenylmethane (a trade name: KAYAHARD (registered trademark) A-A, manufactured by Nippon Kayaku Co., Ltd.), 3.0 g of p-aminophenol, 120.0 g of 2,2-bis[4-(4-maleimidophenoxy)phenyl]propane (a trade name: BMI-4000, manufactured by Daiwa Kasei Industry Co., Ltd.), and 250.0 g of propylene glycol monomethyl ether were charged and allowed to react with each other at 100° C. for 3 hours, thereby obtaining an amino-modified polyimide resin (X-3)-containing solution.
[Fabrication of Resin Films A and B]

Production Examples 4 to 17

(Fabrication of Resin Films A1 to A7 and Resin Films B1 to B7)
Respective components shown in Table 1 were mixed in a blending ratio shown in Table 1 (the units of numerical values in the table are a part by mass, and in the case of a solution, are one as expressed in terms of a solid content), and a varnish having a solid content concentration of 65% by mass was fabricated by using methyl ethyl ketone as a solvent. This varnish was regulated and coated on a PET film having a width of 580 mm (a trade name: G-2, manufactured by Teijin DuPont Films) in a coating width of 525 mm and a thickness of the resin layer after drying of 10 μm. There were thus fabricated resin films A1 to A7 and resin films B1 to B7.
[Fabrication of Prepreg and Copper Clad Laminated Sheet]

Examples 1 to 4 and Comparative Examples 1 to 3

The resin film A was disposed on one surface of a glass cloth that is a fiber base material (thickness: 15 μm, basis weight: 13 g/m$^2$, IPC #1017, base material width: 530 mm, manufactured by Nitto Boseki Co., Ltd.), and the resin film B was disposed on the other surface of the glass cloth, in such a manner that the respective resin layer-forming surfaces were opposed to the glass cloth, respectively. This was put between pressing rolls and laminated, and the resin composition was pressure-impregnated from the both surfaces of the fiber base material. Thereafter, the resultant was cooled with cooling rolls and wound up, thereby obtaining a prepreg. The condition of pressing rolls was set such that a roll temperature was 100° C., a linear pressure was 0.2 MPa, and a speed was 2.0 m/min. In addition, the lamination was carried out at atmospheric pressure.

The surfaces of the resin film A and the resin film B, each being brought into contact with the glass cloth (resin layer-forming surfaces), were heated in advance prior to lamination. The heating position was adjusted such that the center of the heating surface of a heater was positioned 30 mm before the pressing rolls, and the heating temperature was 135° C. in terms of a surface temperature at the center of the heating surface. The heating of the glass cloth itself was similarly performed, and the temperature of the glass cloth was adjusted to 140° C. For the heating, a halogen heater (an apparatus name: UH-USF-CL-700, manufactured by Ushio Inc.) was used.

The thickness of the whole of the obtained prepreg was 30 μm, the thickness of the first resin layer was 7.5 μm, and the thickness of the second resin layer was 7.5 μm. The thickness of each of the layers was determined by performing observation with a scanning electron microscope (SEM), measuring the thickness of each layer in arbitrary ten places, and averaging the measured values.

Four sheets of the above-obtained prepreg were superimposed such that the first resin layer and the second resin layer were opposed to each other, an electrolytic copper foil having a thickness of 12 μm was disposed top and bottom, and the resultant was pressed at a pressure of 3.0 MPa and at a temperature of 240° C. for 60 minutes, thereby obtaining a copper clade laminated sheet.

The raw materials used in each of the Examples are as follows.
[Amino-Modified Polyimide Resin (X)]
Amino-modified polyimide resin (X-1): Amino-modified polyimide resin (X-1)-containing solution prepared in Production Example 1
Amino-modified polyimide resin (X-2): Amino-modified polyimide resin (X-2)-containing solution prepared in Production Example 2
Amino-modified polyimide resin (X-3): Amino-modified polyimide resin (X-3)-containing solution prepared in Production Example 3
[Epoxy Resin (A) and Thermosetting Resin (G)]
NC-7000L: α-Naphthol/cresol novolak type epoxy resin (a trade name, manufactured by Nippon Kayaku Co., Ltd.)
[Amine Compound (B)]
KAYAHARD A-A: 3,3'-Diethyl-4,4'-diaminodiphenylmethane (a trade name, manufactured by Nippon Kayaku Co., Ltd.)
X-22-161A: Both-end amine-modified siloxane (a trade name, manufactured by Shin-Etsu Chemical Co., Ltd., which is a siloxane compound having a primary amino group at the both ends of the molecule; functional group equivalent weight of amino group: 800 g/mol)
[Maleimide Compound (C)]
BMI-4000: 2,2-Bis[4-(4-maleimidophenoxy)phenyl]propane (a trade name, manufactured by Daiwa Kasei Industry Co., Ltd.)
[Amine Compound (D) Having an Acidic Substituent]
p-Aminophenol (manufactured by Kanto Chemical Co., Inc.)
[Inorganic Filler (E)]
SC2050-KC: Fused spherical silica (a trade name, manufactured by Admatechs Company Limited)
[Curing Accelerator (F)]
2MZ-CN: 1-Cyanoethyl-2-methyl imidazole (a trade name, manufactured by Shikoku Chemicals Corporation)

TABLE 1

| | | | Example | | | | Comparative Example | | |
|---|---|---|---|---|---|---|---|---|---|
| | | | 1 | 2 | 3 | 4 | 1 | 2 | 3 |
| First resin layer | Number of resin film A | | 1 | 2 | 3 | 4 | 5 | 6 | 7 |
| | Amino-modified polyimide resin (X) | Amino-modified polyimide resin (X-1) | | | | | | 50 | 100 |
| | | Amino-modified polyimide resin (X-2) | | | | | | | |
| | | Amino-modified polyimide resin (X-3) | | | | | | | |
| | (Amine compound (B)) | KAYAHARD A-A | | | | | | (10) | (20) |
| | | X-22-161A | | | | | | | |
| | (Maleimide compound (C)) | BMI-4000 | | | | | | (40) | (80) |
| | (Amine compound (D) having an acidic substituent) | p-Aminophenol | | | | | | | |
| | Epoxy resin (A) | NC-7000L | 100 | 100 | 100 | 100 | 100 | 50 | |
| | Curing accelerator (F) | 2MZ-CN | 0.2 | 0.2 | 0.2 | 0.2 | 0.2 | 0.2 | 0.2 |
| | Inorganic filler (E) | SC2050-KC | 100 | 100 | 100 | 100 | 100 | 100 | 100 |
| Second resin layer | Number of resin film B | | 1 | 2 | 3 | 4 | 5 | 6 | 7 |
| | Amino-modified polyimide resin (X) | Amino-modified polyimide resin (X-1) | 100 | | | 80 | | 50 | 100 |
| | | Amino-modified polyimide resin (X-2) | | 100 | | | | | |
| | | Amino-modified polyimide resin (X-3) | | | 100 | | | | |
| | (Amine compound (B)) | KAYAHARD A-A | (20) | (10) | (8) | (16) | | (10) | (20) |
| | | X-22-161A | | | (10) | | | | |
| | (Maleimide compound (C)) | BMI-4000 | (80) | (80) | (80) | (64) | | (40) | (80) |
| | (Amine compound (D) having an acidic substituent) | p-Aminophenol | | | | (2) | | | |
| | Thermosetting resin (G) | NC-7000-L | | | | 20 | 100 | 50 | |
| | Curing accelerator (F) | 2MZ-CN | 0.2 | 0.2 | 0.2 | 0.2 | 0.2 | 0.2 | 0.2 |
| | Inorganic filler (E) | SC2050-KC | 100 | 100 | 100 | 100 | 100 | 100 | 100 |
| Characteristics of laminated sheet | | (1) Copper foil peel strength (kN/m) | 1.0 | 1.0 | 1.0 | 1.2 | 2.0 | 1.5 | 1.0 |
| | | (2) Coefficient of thermal expansion (ppm/° C.) | 10.1 | 7.0 | 7.1 | 7.3 | 24.0 | 15.0 | 9.0 |
| | | (3) Flexural elastic modulus (GPa) | 25 | 22 | 22 | 24 | 22 | 25 | 29 |
| | | (4) Glass transition temperature (° C.) | 290 | 290 | 290 | 280 | 200 | 260 | 310 |
| | | (5) Copper-stuck solder heat resistance | A | A | A | A | C | B | A |
| | | (6) Moldability (presence or absence of void) | A | A | A | A | A | B | C |

* The numerical values in the parentheses mean the amounts of the raw material components (B) to (D) as calculated from the use amounts of the used amino-modified polyimide resin (X).

As is clear from Table 1, the laminated sheets obtained in Examples 1 to 4 are excellent in copper foil peel strength, coefficient of thermal expansion, flexural elastic modulus, glass transition temperature, copper-stuck solder heat resistance, and moldability, and they make especially excellent coefficient of thermal expansion, glass transition temperature, copper-stuck solder heat resistance, and moldability compatible with each other. On the other hand, the laminated sheets obtained in Comparative Examples 1 to 3 are not satisfied with all of performances of coefficient of thermal expansion, glass transition temperature, copper-stuck heat resistance, and moldability and are inferior in any one of the characteristics. In the light of the above, it is noted that the prepreg of the present invention is excellent low in thermal expansion properties, heat resistance, and moldability.

INDUSTRIAL APPLICABILITY

The prepreg of the present invention is excellent in low thermal expansion properties, heat resistance, and moldability, and therefore, it is useful for highly integrated semiconductor packages, printed wiring boards for electronic devices, and so on.

REFERENCE SIGNS LIST

1: Support (core board)
2: Prepreg (insulating layer)
3: Via hole
4: Circuit pattern
5: Build-up layer
6: Coreless board
10: Fiber base material layer
11: First resin layer
12: Second resin layer
13: Fiber base material
100: Prepreg

The invention claimed is:

1. A prepreg comprising a fiber base material layer containing a fiber base material, a first resin layer formed on one surface of the fiber base material layer, and a second resin layer formed on the other surface of the fiber base material layer, wherein the first resin layer is a layer obtained through layer formation of a resin composition (I) containing, as a main component of resin components, an epoxy resin (A), and the second resin layer is a layer obtained through layer formation of a resin composition (II) containing, as a main component of resin components, an amino-modified polyimide resin (X) that is a reaction product between an amine compound (B) having at least two primary amino groups in one molecule thereof and a maleimide compound (C) having at least two N-substituted maleimide groups in one molecule thereof, wherein the component (B) contains a siloxane compound having at least two primary amino groups in one molecule thereof.

2. The prepreg according to claim 1, wherein the amino-modified polyimide resin (X) is a reaction product among an amine compound (B) having at least two primary amino groups in one molecule thereof, a maleimide compound (C) having at least two N-substituted maleimide groups in one molecule thereof, and an amine compound (D) having an acidic substituent represented by the following general formula (D-1):

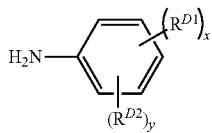 (D-1)

wherein, $R^{D1}$'s each independently represent a hydroxy group, a carboxy group, or a sulfonic acid group, each of which is an acidic substituent; $R^{D2}$'s each independently represent a hydrogen atom, an aliphatic hydrocarbon group having 1 to 5 carbon atoms, or a halogen atom; x is an integer of 1 to 5; y is an integer of 0 to 4; and a sum of x and y is 5.

3. The prepreg according to claim 1, wherein the resin composition (II) further contains at least one thermosetting resin (G) selected from the group consisting of an epoxy resin and a cyanate resin.

4. The prepreg according to claim 1, wherein at least one selected from the group consisting of the resin composition (I) and the resin composition (II) further contains an inorganic filler (E).

5. A laminated sheet obtained through lamination molding of the prepreg according to claim 1.

6. A printed wiring board comprising the laminated sheet according to claim 5.

7. A semiconductor package comprising a semiconductor device mounted on the printed wiring board according to claim 6.

8. A coreless board comprising an insulating layer formed by using the prepreg according to claim 1.

9. A method of producing a coreless board, comprising a step of disposing the prepreg according to claim 1 so as to come into contact with a circuit pattern.

* * * * *